(12) United States Patent
Matsumoto

(10) Patent No.: US 12,446,452 B2
(45) Date of Patent: Oct. 14, 2025

(54) METHOD OF MANUFACTURING DISPLAY DEVICE

(71) Applicant: Magnolia White Corporation, Tokyo (JP)

(72) Inventor: Yuko Matsumoto, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 406 days.

(21) Appl. No.: 18/158,481

(22) Filed: Jan. 24, 2023

(65) Prior Publication Data

US 2023/0240122 A1 Jul. 27, 2023

(30) Foreign Application Priority Data

Jan. 27, 2022 (JP) ................. 2022-011094

(51) Int. Cl.
| | |
|---|---|
| *H10K 71/00* | (2023.01) |
| *H10K 59/12* | (2023.01) |
| *H10K 59/122* | (2023.01) |
| *H10K 59/35* | (2023.01) |
| *H10K 59/80* | (2023.01) |
| *H10K 71/20* | (2023.01) |

(52) U.S. Cl.
CPC ......... *H10K 71/00* (2023.02); *H10K 59/1201* (2023.02); *H10K 59/122* (2023.02); *H10K 59/873* (2023.02); *H10K 71/231* (2023.02); *H10K 59/35* (2023.02); *H10K 59/353* (2023.02); *H10K 59/871* (2023.02)

(58) Field of Classification Search
CPC .. H10K 71/00; H10K 71/231; H10K 59/1201; H10K 59/122
See application file for complete search history.

(56) References Cited

U.S. PATENT DOCUMENTS

| | | | |
|---|---|---|---|
| 2004/0101988 A1* | 5/2004 | Roman, Jr. ............ | H10K 71/40 257/E21.235 |
| 2004/0160170 A1 | 8/2004 | Sato et al. | |
| 2009/0004772 A1* | 1/2009 | Jinbo ................ | H01L 21/02491 257/E51.024 |
| 2009/0009069 A1 | 1/2009 | Takata | |
| 2012/0252149 A1 | 10/2012 | Hiroki et al. | |

(Continued)

FOREIGN PATENT DOCUMENTS

| | | |
|---|---|---|
| JP | 2000-195677 A | 7/2000 |
| JP | 2004-207217 A | 7/2004 |

(Continued)

*Primary Examiner* — Victoria K. Hall
(74) *Attorney, Agent, or Firm* — XSENSUS LLP

(57) ABSTRACT

According to one embodiment, a method of manufacturing a display device includes forming a first organic layer covering a lower electrode and a second organic layer on an upper portion of a partition, forming a first upper electrode and a second upper electrode, forming a first transparent layer and a second transparent layer, forming a first inorganic layer and a second inorganic layer, forming a sealing layer on the first inorganic layer and the second inorganic layer, forming a resist covering the sealing layer directly above the lower electrode and covering a part of the sealing layer directly above the partition, performing dry etching using the resist as a mask, and performing wet etching by an acidic solution using the resist as a mask.

13 Claims, 13 Drawing Sheets

(56) References Cited

U.S. PATENT DOCUMENTS

| | | |
|---|---|---|
| 2012/0252150 A1 | 10/2012 | Hiroki et al. |
| 2019/0157358 A1 | 5/2019 | Maeda |
| 2019/0363275 A1 | 11/2019 | Ochi et al. |

FOREIGN PATENT DOCUMENTS

| | | |
|---|---|---|
| JP | 2008-135325 A | 6/2008 |
| JP | 2009-32673 A | 2/2009 |
| JP | 2010-118191 A | 5/2010 |
| JP | 2012-216493 A | 11/2012 |
| JP | 2019-96439 A | 6/2019 |
| WO | 2018/179308 A1 | 10/2018 |

\* cited by examiner

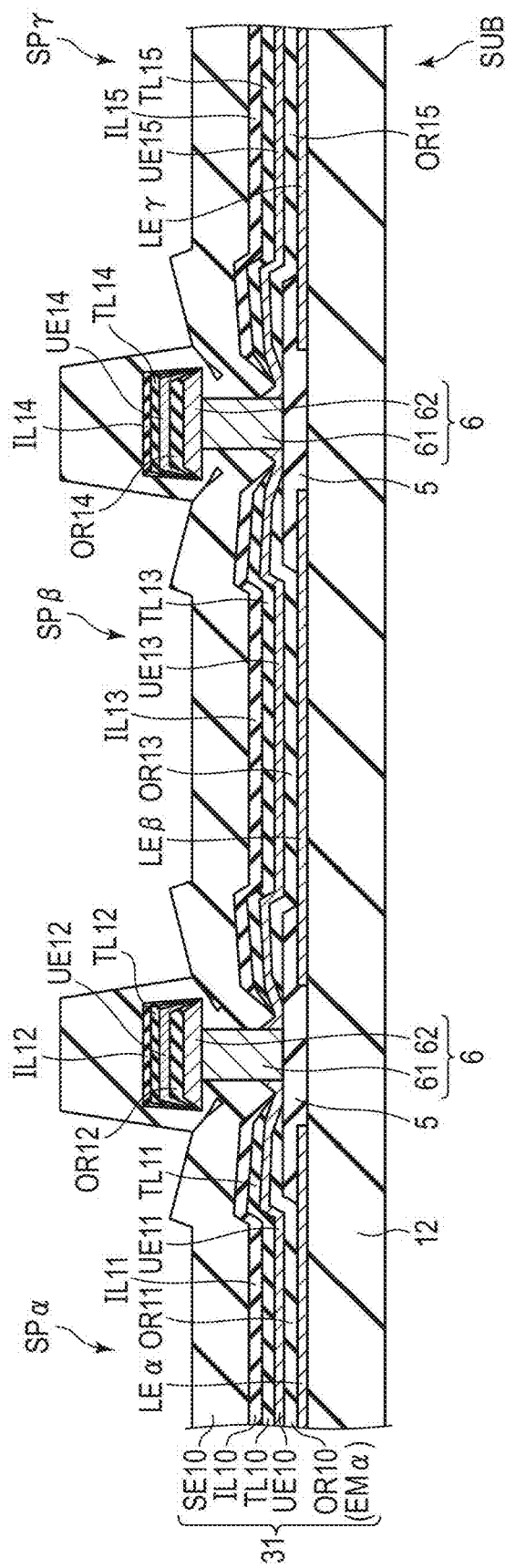
F I G. 7

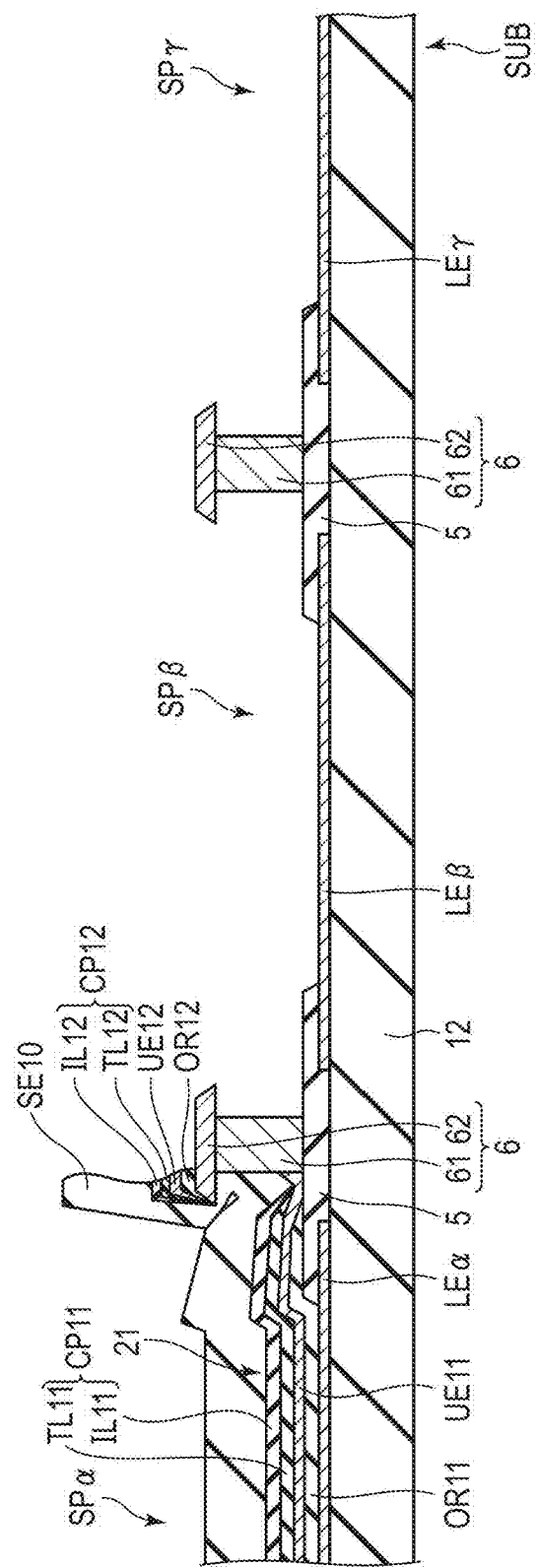
F I G. 12

| Concentration | pH | Immersion time | Remaining LiF | Damaged partition |
|---|---|---|---|---|
| 99.8% | 2.5 | 2 min. | None | None |
| 2% | 2.7 | 2 min. | None | None |
| 1% | 2.8 | 2 min. | None | None |
| 0.5% | 3.0 | 2 min. | None | None |
| 0.1% | 3.4 | 2 min. | None | None |
| 0.01% | 3.6 | 2 min. | Partially | None |

F I G. 13

| | | Concentration | | | | | | |
|---|---|---|---|---|---|---|---|---|
| | | 0.1% | 0.5% | 1% | 2% | 5% | 10% | 15% |
| Immersion time | 5 min. | △ | △ | △ | △ | △ | △ | △ |
| | 10 min. | ○ | ○ | ○ | ○ | ○ | ○ | ○ |
| | 15 min. | ○ | ○ | ○ | ○ | ○ | ○ | ○ |

F I G. 14

METHOD OF MANUFACTURING DISPLAY DEVICE

CROSS-REFERENCE TO RELATED APPLICATIONS

This application is based upon and claims the benefit of priority from Japanese Patent Application No. 2022-011094, filed Jan. 27, 2022, the entire contents of which are incorporated herein by reference.

FIELD

Embodiments described herein relate generally to a method of manufacturing a display device.

BACKGROUND

Recently, display devices applying organic light-emitting diodes (OLEDs) as display elements have been put to practical use. This display element comprises a pixel circuit including a thin-film transistor, a lower electrode connected to the pixel circuit, an organic layer covering the lower electrode, and an upper electrode covering the organic layer. The organic layer contains functional layers such as a hole-transport layer and an electron-transport layer, in addition to a light-emitting layer.

Such a display element is easily degraded by moisture. Therefore, there is a need for a technology to reliably seal the display element.

BRIEF DESCRIPTION OF THE DRAWINGS

FIG. 7 illustrates a process of forming a first thin film.

FIG. 12 illustrates a process of removing a resist.

FIG. 13 shows results of Experiment 1.

FIG. 14 shows results of Experiment 2.

DETAILED DESCRIPTION

Figure 1:
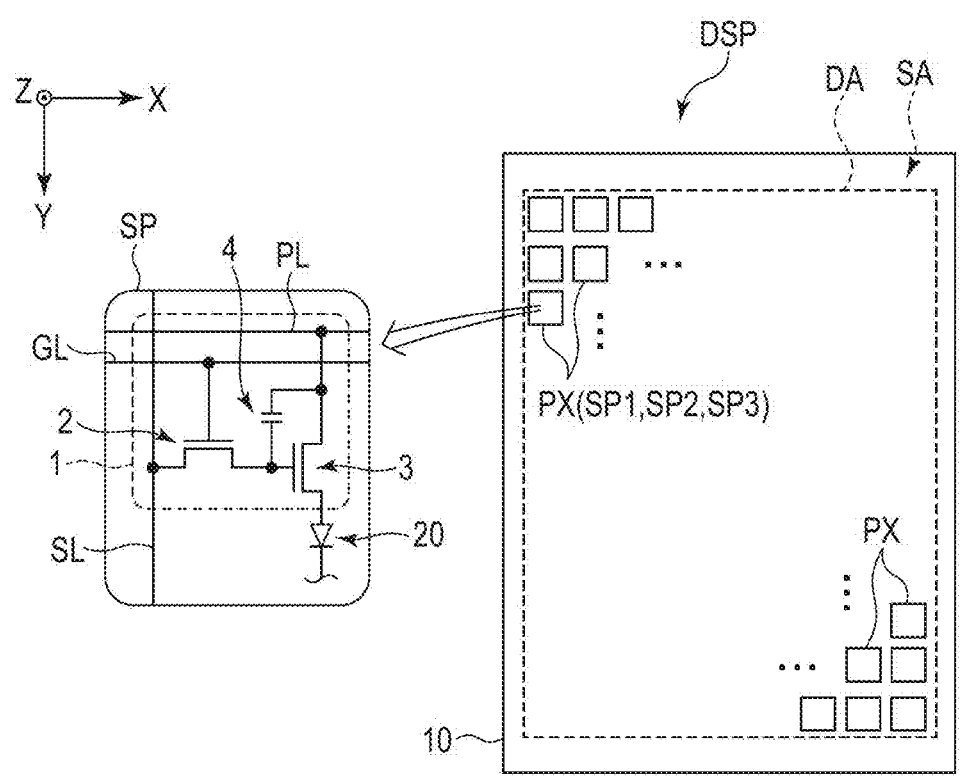
FIG. 1 shows a configuration example of a display device DSP.

In general, according to one embodiment, a method of manufacturing a display device, comprises: preparing a processing substrate in which a lower electrode, a rib having an aperture overlapping the lower electrode, and a partition including a lower portion disposed on the rib and an upper portion disposed on the lower portion and protruding from a side surface of the lower portion are formed above a substrate; forming a first organic layer covering the lower electrode, and a second organic layer spaced apart from the first organic layer and located on the upper portion; forming a first upper electrode located on the first organic layer and in contact with the lower portion, and a second upper electrode spaced apart from the first upper electrode and located on the second organic layer; forming a first transparent layer located on the first upper electrode, and a second transparent layer spaced apart from the first transparent layer and located on the second upper electrode; forming a first inorganic layer located on the first transparent layer, and a second inorganic layer spaced apart from the first inorganic layer and located on the second transparent layer; forming a sealing layer located on the first inorganic layer and the second inorganic layer and covering the partition; forming a resist covering the sealing layer directly above the lower electrode and covering a part of the sealing layer directly above the partition; performing dry etching using the resist as a mask to remove the sealing layer exposed from the resist; and performing wet etching by an acidic solution using the resist as a mask to remove the second inorganic layer exposed from the resist.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as a first direction, a direction along the Y axis is referred to as a second direction and direction along the Z axis is referred to as a third direction. Viewing an element in an X-Y plane defined by the X-axis and the Y-axis is referred to as plan view.

The display device according to the present embodiment is an organic electroluminescent display device comprising an organic light-emitting diode (OLED) as a display element, and can be installed in TVs, personal computers, in-vehicle equipment, tablet terminals, smartphones, mobile phone terminals, and the like.

FIG. 1 shows a configuration example of a display device DSP.

The display device DSP includes a display area DA on which images are displayed and a peripheral area SA around the display area DA on an insulating substrate 10. The substrate 10 may be glass or a flexible resin film.

In the present embodiment, the shape of the substrate 10 in plan view is rectangular. However, the shape of the substrate 10 in plan view is not limited to a rectangle, but may be other shapes such as a square, circle, or oval.

The display area DA comprises a plurality of pixels PX arranged in a matrix in a first direction X and a second direction Y. The pixel PX includes a plurality of sub-pixels SP. In one example, the pixel PX includes a red sub-pixel SP1, a green sub-pixel SP2, and a blue sub-pixel SP3. Note that the pixel PX may include sub-pixels SP of other colors such as white together with sub-pixels SP1, SP2, and SP3, or in place of any of the sub-pixels SP1, SP2, and SP3.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are switching elements configured by a thin-film transistors, for example.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of a source electrode and a drain electrode is connected to a power line PL and the capacitor 4, and the other is connected to an anode of the display element 20.

Note that, the configuration of the pixel circuit 1 is not limited to the illustrated example. For example, the pixel circuit 1 may comprise more thin-film transistors and capacitors.

The display element 20 is an organic light-emitting diode (OLED) as a light-emitting element, which, in some cases, are referred to as an organic EL element. For example, the sub-pixel SP1 comprises a display element 20 that emits light in a red wavelength range, the sub-pixel SP2 comprises a display element 20 that emits light in a green wavelength range, and the sub-pixel SP3 comprises a display element 20 that emits light in a blue wavelength range.

Figure 2:
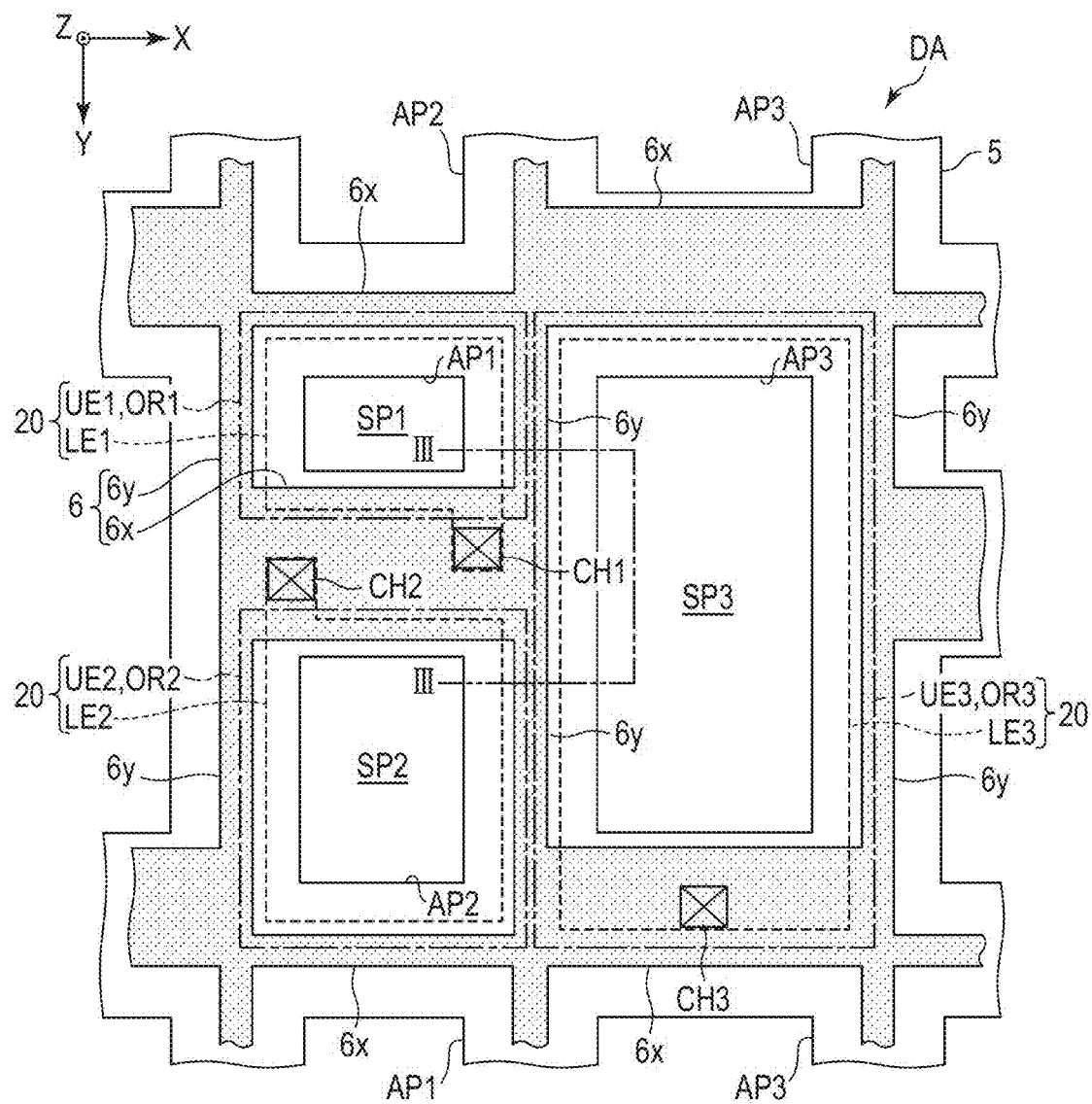
FIG. 2 shows an example of a layout of sub-pixels SP1, SP2, and SP 3.

FIG. 2 shows an example of a layout of the sub-pixels SP1, SP2, and SP3.

In the example in FIG. 2, the sub-pixel SP1 and the sub-pixel SP2 are arranged in the second direction Y. Furthermore, the sub-pixels SP1 and SP2 are respectively arranged with the sub-pixel SP3 in the first direction X.

In the case where the sub-pixels SP1, SP2, and SP3 are in such a layout, a column in which the sub-pixels SP1 and SP2 are alternately arranged in the second direction Y, and a column in which a plurality of sub-pixels SP3 are arranged in the second direction Y are formed in the display area DA. These columns are alternately arranged in the first direction X.

Note that the layout of the sub-pixels SP1, SP2, and SP3 is not limited to the example in FIG. 2. As another example, the sub-pixels SP1, SP2, and SP3 in each pixel PX may be arranged in order in the first direction X.

A rib 5 and a partition 6 are arranged in the display area DA. The rib 5 has apertures AP1, AP2, and AP3 in the sub-pixels SP1, SP2, and SP3, respectively. In the example shown in FIG. 2, the aperture AP2 is larger than the aperture AP1, and the aperture AP3 is larger than the aperture AP2.

The partition 6 overlaps the rib 5 in plan view. The partition 6 has a plurality of first partitions 6x extending in the first direction X and a plurality of second partitions 6y extending in the second direction Y. A plurality of first partitions 6x are disposed between adjacent apertures AP1 and AP2 in the second direction Y, and between two adjacent apertures AP3 in the second direction Y, respectively. A plurality of second partitions 6y are disposed between adjacent apertures AP1 and AP3 in the first direction X, and between adjacent apertures AP2 and AP3 in the first direction X, respectively.

In the example of FIG. 2, the first partition 6x and the second partition 6y are connected to each other. As a result, the partition 6 as a whole is formed into a lattice shape surrounding the apertures AP1, AP2, and AP3. The partition 6 can be considered as having apertures in the sub-pixels SP1, SP2 and SP3 in the same manner as the rib 5.

The sub-pixel SP1 comprises a lower electrode LE1, an upper electrode UE1, and an organic layer OR1 that overlap with the aperture AP1, respectively. The sub-pixel SP2 comprises a lower electrode LE2, an upper electrode UE2, and an organic layer OR2 that overlap with the aperture AP2, respectively. The sub-pixel SP3 comprises a lower electrode LE3, an upper electrode UE3, and an organic layer OR3 that overlap with the aperture AP3, respectively.

In the example in FIG. 2, the outer shape of the lower electrodes LE1, LE2, and LE3 are shown as dotted lines, and the outer shapes of the organic layers OR1, OR2, and OR3 and the upper electrodes UE1, UE2, and UE3 are shown as chain lines. Each peripheral edge of the lower electrodes LE1, LE2, and LE3 overlaps the rib 5. The outer shape of the upper electrode UE1 substantially matches the outer shape of the organic layer OR1, and each peripheral edge of the upper electrode UE1 and the organic layer OR1 overlaps the partition 6. The outer shape of the upper electrode UE2 substantially matches the outer shape of the organic layer OR2, and each peripheral edge of the upper electrode UE2 and the organic layer OR2 overlaps the partition 6. The outer shape of the upper electrode UE3 substantially matches the outer shape of the organic layer OR3, and each peripheral edge of the upper electrode UE3 and the organic layer OR3 overlaps the partition 6.

The lower electrode LE1, the upper electrode UE1, and the organic layer OR1 configure the display element 20 of the sub-pixel SP1. The lower electrode LE2, the upper electrode UE2, and the organic layer OR2 configure the display element 20 of the sub-pixel SP2. The lower electrode LE3, the upper electrode UE3, and the organic layer OR3 configure the display element 20 of the sub-pixel SP3. The lower electrodes LE1, LE2, and LE3, for example, correspond to the anodes of the display element 20. The upper electrodes UE1, UE2, and UE3 correspond to the cathodes of the display element 20 or common electrodes.

The lower electrode LE1 is connected to the pixel circuit 1 of the sub-pixel SP1 (see FIG. 1) through a contact hole CH1. The lower electrode LE2 is connected to the pixel circuit 1 of the sub-pixel SP2 through a contact hole CH2. The lower electrode LE3 is connected to the pixel circuit 1 of the sub-pixel SP3 through a contact hole CH3.

Figure 3:
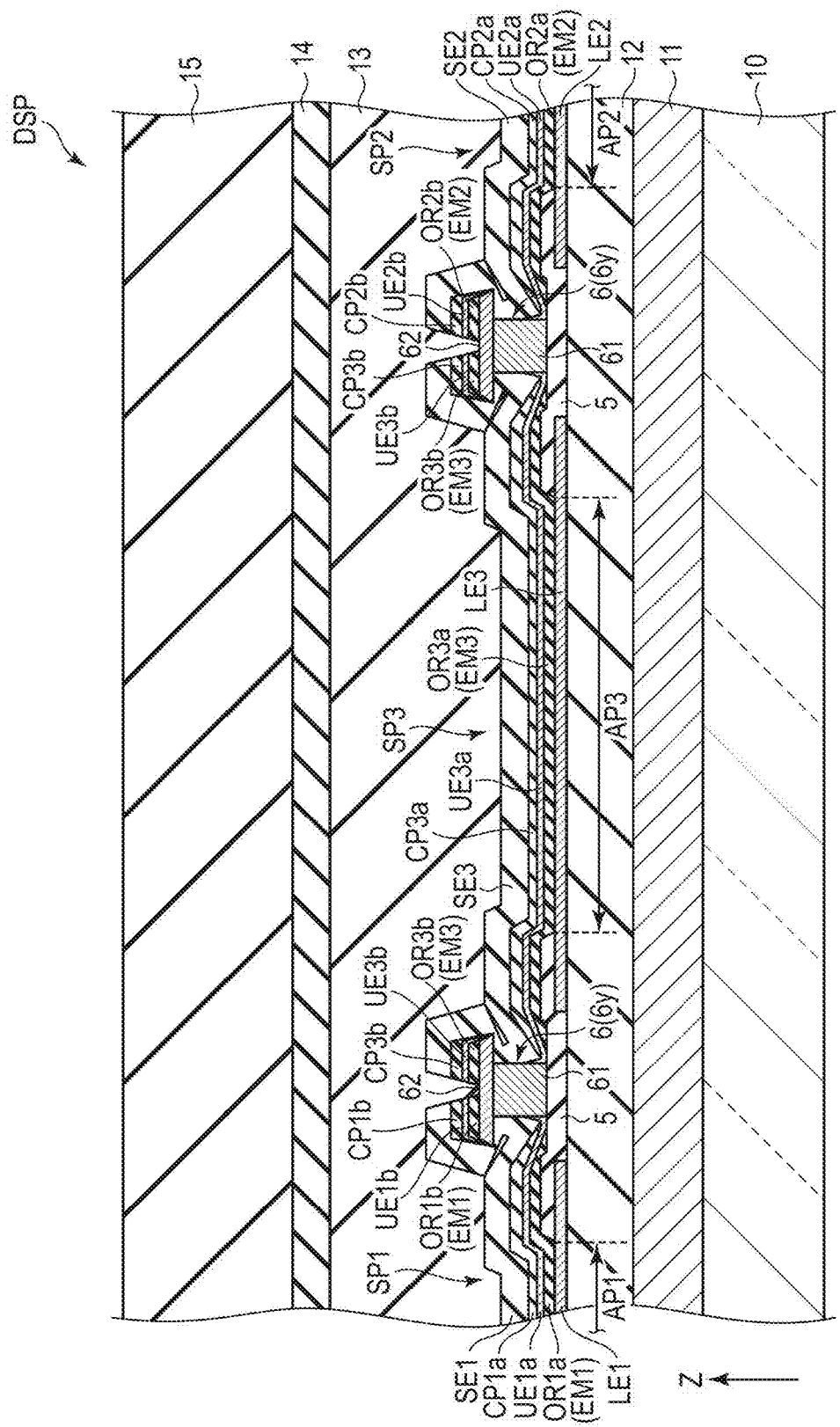
FIG. 3 is a schematic cross-sectional view of the display device DSP along a III-III line in FIG. 2.

FIG. 3 is a schematic cross-sectional view of the display device DSP along a III-III line in FIG. 2.

A circuit layer 11 is disposed on the substrate 10 described above. The circuit layer 11 includes various circuits such as the pixel circuit 1, and various lines such as the scanning line GL, the signal line SL, and the power line PL shown in FIG. 1. The circuit layer 11 is covered by an insulating layer 12. The insulating layer 12 functions as a planarization film that planarizes unevenness caused by the circuit layer 11.

The lower electrodes LE1, LE2, and LE3 are disposed on the insulating layer (organic insulating layer) 12. The rib (inorganic insulating layer) 5 is disposed on the insulating layer 12 and the lower electrodes LE1, LE2, and LE3. The ends of the lower electrodes LE1, LE2, and LE3 are covered by the rib 5.

The partition 6 includes a lower portion (stem) 61 disposed on the rib 5 and an upper portion (shade) 62 covering the upper surface of the lower portion 61. The upper portion 62 has a greater width than the lower portion 61. As a result, in FIG. 3, both ends of the upper portion 62 protrude from the side surfaces of the lower portion 61. Such a shape of the partition 6 can also be referred to as an overhang shape.

The organic layer OR1 shown in FIG. 2 includes a first portion OR1a and a second portion OR1b spaced apart from each other as shown in FIG. 3. The first portion OR1a contacts the lower electrode LE1 through the aperture AP1, covers the lower electrode LE1, and overlaps a part of the rib 5. The second portion OR1b is located on the upper portion 62.

In addition, the upper electrode UE1 shown in FIG. 2 includes a first portion UE1a and a second portion UE1b spaced apart from each other as shown in FIG. 3. The first portion UE1a faces the lower electrode LE1 and is located on the first portion OR1a. Furthermore, the first portion UE1a is in contact with a side surface of the lower portion 61. The second portion UE1b is located above the partition 6 and located on the second portion OR1b.

The organic layer OR2 shown in FIG. 2 includes a first portion OR2a and a second portion OR2b spaced apart from each other as shown in FIG. 3. The first portion OR2a contacts the lower electrode LE2 through the aperture AP2, covers the lower electrode LE2, and overlaps a part of the rib 5. The second portion OR2b is located on the upper portion 62.

In addition, the upper electrode UE2 shown in FIG. 2 includes a first portion UE2a and a second portion UE2b spaced apart from each other as shown in FIG. 3. The first portion UE2a faces the lower electrode LE2 and is located on the first portion OR2a. Furthermore, the first portion UE2a is in contact with a side surface of the lower portion 61. The second portion UE2b is located above the partition 6 and located on the second portion OR2b.

The organic layer OR3 shown in FIG. 2 includes a first portion OR3a and a second portion OR3b spaced apart from each other as shown in FIG. 3. The first portion OR3a contacts the lower electrode LE3 through the aperture AP3, covers the lower electrode LE3, and overlaps a part of the rib 5. The second portion OR3b is located on the upper portion 62.

In addition, the upper electrode UE3 shown in FIG. 2 includes a first portion UE3a and a second portion UE3b spaced apart from each other as shown in FIG. 3. The first portion UE3a faces the lower electrode LE3 and is located on the first portion OR3a. Furthermore, the first portion UE3a is in contact with a side surface of the lower portion 61. The second portion UE3b is located above the partition 6 and located on the second portion OR3b.

In the example shown in FIG. 3, the sub-pixels SP1, SP2, and SP3 include cap layers (optical adjustment layers) CP1, CP2, and CP3 for adjusting optical properties of light emitted by light-emitting layers of the organic layers OR1, OR2, and OR3.

The cap layer CP1 includes a first portion CP1a and a second portion CP1b spaced apart from each other. The first portion CP1a is located at the aperture AP1 and located on the first portion UE1a. The second portion CP1b is located above the partition 6 and located on the second portion UE1b.

The cap layer CP2 includes a first portion CP2a and a second portions CP2b spaced apart from each other. The first portion CP2a is located at the aperture AP2 and located on the first portion UE2a. The second portion CP2b is located above the partition 6 and located on the second portion UE2b.

The cap layer CP3 includes a first portion CP3a and a second portions CP3b spaced apart from each other. The first portion CP3a is located at the aperture AP3 and located on the first portion UE3a. The second portion CP3b is located above the partition 6 and located on the second portion UE3b.

In the sub-pixels SP1, SP2, and SP3, sealing layers SE1, SE2, and SE3 are disposed, respectively. The sealing layer SE1 continuously covers each member of the sub-pixel SP1 including the first portion CP1a, the partition 6, and the second portion CP1b. The sealing layer SE2 continuously covers each member of the sub-pixel SP2 including the first portion CP2a, the partition 6, and the second portion CP2b. The sealing layer SE3 continuously covers each member of the sub-pixel SP3 including the first portion CP3a, the partition 6, and the second portion CP3b.

In the example of FIG. 3, between the sub-pixels SP1 and SP3, the second portion OR1b, the second portion UE1b, the second portion CP1b, and the sealing layer SE1 on the partition 6, are spaced apart from the second portion OR3b, the second portion UE3b, the second portion CP3b, and the sealing layer SE3 on the partition 6. In addition, between the sub-pixels SP2 and SP3, the second portion OR2b, the second portion UE2b, the second portion CP2b, and the sealing layer SE2 on the partition 6, are spaced apart from the second portion OR3b, the second portion UE3b, the second portion CP3b, and the sealing layer SE3 on the partition 6.

The sealing layers SE1, SE2, and SE3 are covered by a resin layer 13. The resin layer 13 is covered by a sealing layer 14. Furthermore, the sealing layer 14 is covered by a resin layer 15.

The insulating layer 12 is formed of an organic material. The rib 5 and the sealing layers 14, SE1, SE2, and SE3 are formed of an inorganic material, such as silicon nitride (SiNx). The thickness of the rib 5, which is formed of an inorganic material, is sufficiently smaller than the thicknesses of the partition 6 and the insulating layer 12. In one example, the thickness of the rib 5 is 200 nm or more and 400 nm or less.

The lower portion 61 of the partition 6 is formed of a conductive material. Both the lower portion 61 and the upper portion 62 of the partition 6 may also be conductive.

The lower electrodes LE1, LE2, and LE3 may be formed of a transparent conductive material such as ITO, or may have a laminated structure of a metallic material such as silver (Ag) and a transparent conductive material. The upper electrodes UE1, UE2, and UE3 are formed of a metallic material such as an alloy of magnesium and silver (MgAg). The upper electrodes UE1, UE2, and UE3 may be formed of a transparent conductive material such as ITO.

In a case where the potentials of the lower electrodes LE1, LE2, and LE3 are relatively higher than the potentials of the upper electrodes UE1, UE2, and UE3, the lower electrodes LE1, LE2, and LE3 correspond to anodes, and the upper electrodes UE1, UE2, and UE3 correspond to cathodes. In addition, in a case where the potentials of the upper electrodes UE1, UE2, and UE3 are relatively higher than the potentials of the lower electrodes LE1, LE2, and LE3, the upper electrodes UE1, UE2, and UE3 correspond to anodes, and the lower electrodes LE1, LE2, and LE3 correspond to cathodes.

The organic layers OR1, OR2, and OR3 include multiple functional layers. In addition, the first portion OR1a and the second portion OR1b of the organic layer OR1 include light-emitting layers EM1 formed of the same material. The first portion OR2a and the second portion OR2b of the organic layer OR2 include light-emitting layers EM2 formed of the same material. The first portion OR3a and the second portion OR3b of the organic layer OR3 include light-emitting layers EM3 formed of the same material. The light-emitting layer EM1, the light-emitting layer EM2, and the light-emitting layer EM 3 are formed by materials that emit light in different wavelength ranges from each other.

The cap layers CP1, CP2, and CP3 are formed by, for example, a multi-layered body of transparent thin films. The multi-layered body may include, as thin films, a thin film formed by an inorganic material and a thin film formed by an organic material. These plurality of thin films have different refractive indices from each other. The materials of the thin films configuring the multi-layered body are different from the material of the upper electrodes UE1, UE2, and UE3 and are different from the material of the sealing layers SE1, SE2, and SE3. Note that the cap layers CP1, CP2, and CP3 may be omitted.

A common voltage is supplied to the partition 6. This common voltage is supplied to each of the first portions UE1a, UE2a, and UE3a of the upper electrode in contact with the side surface of the lower portion 61. A pixel voltage is supplied to the lower electrodes LE1, LE2, and LE3 through the pixel circuit 1 included in each of the sub-pixels SP1, SP2, and SP3.

When a potential difference is formed between the lower electrode LE1 and the upper electrode UE1, the light-emitting layer EM1 of the first portion OR1a of the organic layer OR1 emits light in a red wavelength range. When a potential difference is formed between the lower electrode LE2 and the upper electrode UE2, the light-emitting layer EM2 of the first portion OR2a of the organic layer OR2 emits light in a green wavelength range. When a potential difference is formed between the lower electrode LE3 and the upper electrode UE3, the light-emitting layer EM3 of the first portion OR3a of the organic layer OR3 emits light in a blue wavelength range.

As another example, the light-emitting layers of the organic layers OR1, OR2, and OR3 may emit light of the same color (e.g., white). In this case, the display device DSP may comprise a color filter that converts the light emitted by the light-emitting layers into light of a color corresponding to the sub-pixels SP1, SP2, and SP3. The display device DSP may also comprise a layer including quantum dots that are excited by the light emitted by the light-emitting layer and generate light of the color corresponding to the sub-pixels SP1, SP2, and SP3.

Figure 4:
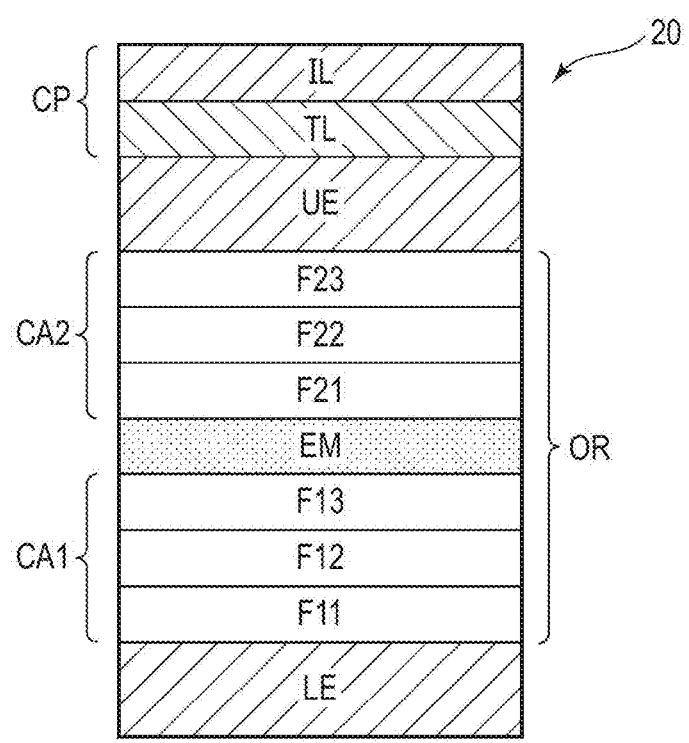
FIG. 4 shows an example of the configuration of a display element 20.

FIG. 4 shows an example of a configuration of the display device 20.

The lower electrode LE shown in FIG. 4 corresponds to each of the lower electrodes LE1, LE2, and LE3 shown in FIG. 3. The organic layer OR shown in FIG. 4 corresponds to each of the organic layers OR1, OR2, and OR3 shown in FIG. 3. The upper electrode UE shown in FIG. 4 corresponds to each of the upper electrodes UE1, UE2, and UE3 shown in FIG. 3.

The organic layer OR includes a carrier adjustment layer CA1, a light-emitting layer EM, and a carrier adjustment layer CA2. The carrier adjustment layer CA1 is located between the lower electrode LE and the light-emitting layer EM, and the carrier adjustment layer CA2 is located between the light-emitting layer EM and the upper electrode UE. The carrier adjustment layers CA1 and CA2 include multiple functional layers. The following describes an example in a case where the lower electrode LE corresponds to the anode, and the upper electrode UE corresponds to the cathode.

The carrier adjustment layer CA1 includes, as functional layers, a hole-injection layer F11, a hole-transport layer F12, and an electron blocking layer F13, etc. The hole-injection layer F11 is disposed on the lower electrode LE, the hole-transport layer F12 is disposed on the hole-injection layer F11, the electron blocking layer F13 is disposed on the hole-transport layer F12, and the light-emitting layer EM is disposed on the electron blocking layer F13.

The carrier adjustment layer CA2 includes, as functional layers, a hole blocking layer F21, an electron-transport layer F22, and an electron injection layer F23, etc. The hole blocking layer F21 is disposed on the light-emitting layer EM, the electron-transport layer F22 is disposed on the hole blocking layer F21, the electron injection layer F23 is disposed on the electron-transport layer F22, and the upper electrode UE is disposed on the electron injection layer F23.

Note that, the carrier adjustment layers CA1 and CA2 may include other functional layers such as carrier generation layers as needed in addition to the functional layers described above, or may omit at least one of the above functional layers.

The cap layer CP shown in FIG. 4 corresponds to each of the cap layers CP1, CP2, and CP3 in shown FIG. 3. The cap layer CP includes a transparent layer (first layer) TL and an inorganic layer (second layer) IL. The transparent layer TL is disposed on the upper electrode UE, and the inorganic layer IL is disposed on the transparent layer TL. The transparent layer TL is a thin film formed, for example, by an organic material and is a high refractive index layer with a refractive index greater than that of the upper electrode UE. The inorganic layer IL is a transparent thin film formed, for example, by lithium fluoride (LiF) and is a low refractive index layer with a refractive index smaller than that of the transparent layer TL.

Note that, in the example shown in FIG. 4, the cap layer CP is a two-layered stacked layer body of the transparent layer TL and the inorganic layer IL, however, may also be a stacked layer body of three or more layers. In the cap layer CP, the inorganic layer IL is located at the uppermost layer and is in contact with the sealing layers SE1, SE2, and SE3 shown in FIG. 3.

Next, an example of a manufacturing method of the display device DSP will be described.

Figure 5:
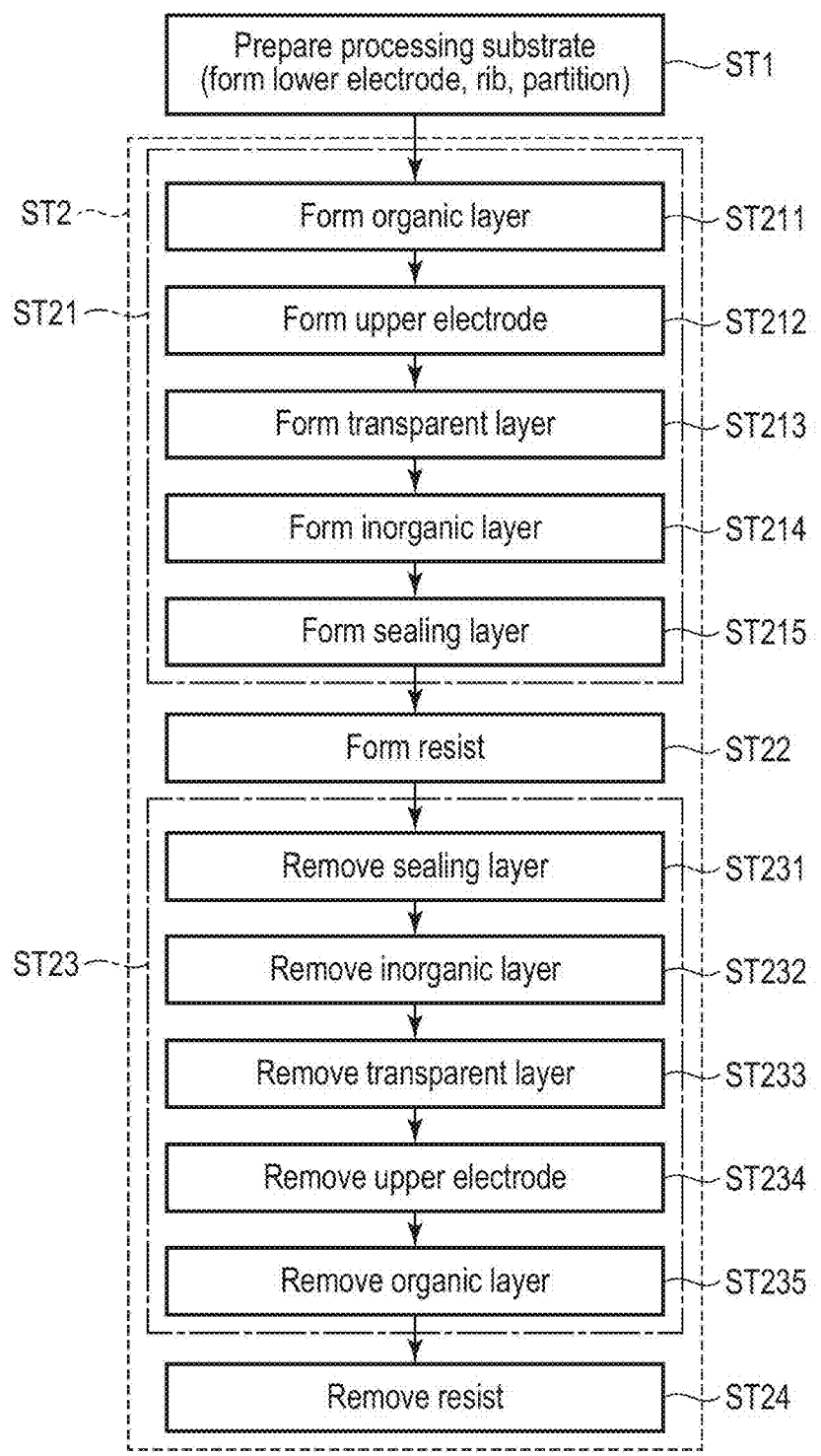
FIG. 5 is a flow diagram illustrating an example of a method of manufacturing the display device DSP.

FIG. 5 is a flow diagram illustrating an example of the manufacturing method of the display device DSP.

The manufacturing method shown here can be roughly divided into a process of preparing a processing substrate SUB that serves as a base for sub-pixels SPα, SPβ, and SPγ (step ST1) and a process of forming sub-pixels SPα (step ST2). After step ST2, a process of forming sub-pixels SPβ similar to the process of forming sub-pixels SPα is performed, and a process of forming sub-pixels SPγ is further performed. Note that the sub-pixels SPα, SPβ, and SPγ here are one of the sub-pixels SP1, SP2, and SP3 described above.

In step ST2, first, a first thin film 31 including a light-emitting layer EMα is formed on the processing substrate SUB (step ST21). In the process of forming the first thin film 31, first, an organic layer OR10 is formed on the processing substrate SUB (step ST211). Then, an upper electrode UE10 is formed on the organic layer OR10 (step ST212). Then, a transparent layer TL10 configuring the cap layer is formed on the upper electrode UE10 (step ST213). Then, an inorganic layer IL10 configuring the cap layer is formed on the transparent layer TL10 (step ST214). Then, a sealing layer SE10 is formed on the inorganic layer IL10 (step ST215).

Then, a resist 41 patterned in a predetermined shape is formed on the first thin film 31 (step ST22).

Then, a part of the first thin film 31 is removed by etching using the resist 41 as a mask (step ST23). In the process of removing a part of the first thin film 31, first, the sealing layer SE10 exposed from the resist 41 is removed (step ST231). Then, the inorganic layer IL10 exposed from the resist 41 and the sealing layer SE10, is removed (step ST232). Then, the transparent layer TL10 exposed from the resist 41, the sealing layer SE10, and the inorganic layer IL10, is removed (step ST233). Then, the upper electrode UE10 exposed from the resist 41, the sealing layer SE10, the inorganic layer IL10, and the transparent layer TL10, is removed (step ST234). Then, the organic layer OR10 exposed from the resist 41, the sealing layer SE10, the inorganic layer IL10, the transparent layer TL10, and the upper electrode UE10, is removed (step ST235).

Then, the resist 41 is removed (step ST24).

As a result, a sub-pixel SPα is formed. The sub-pixel SPα comprises a display element 21 including the first thin film 31 in a predetermined shape.

The process of forming a sub-pixel SPβ includes the same processes as in step ST21 to step ST24, however, in step ST21, a second thin film 32 including a light-emitting layer EM is formed instead of the first thin film 31. Then, by patterning the second thin film 32, the sub-pixel SPβ is formed. The sub-pixel SPβ comprises a display element 22 including the second thin film 32 in a predetermined shape. Note that, illustrations of the second thin film 32, the light-emitting layer EMβ, and the display element 22 are omitted here.

The process of forming a sub-pixel SPγ includes the same processes as in step ST21 to step ST24, however, in step ST21, a third thin film 33 including a light-emitting layer EMγ is formed instead of the first thin film 31. Then, by patterning the third thin film 33, the sub-pixel SPγ is formed. The sub-pixel SPγ comprises a display element 23 including the third thin film 33 in a predetermined shape. Note that, illustrations of the third thin film 33, the light-emitting layer EMγ, and the display element 23 are omitted here.

The light-emitting layer EMα, the light-emitting layer EMβ, and the light-emitting layer EMγ are formed by materials that emit light in different wavelength ranges from each other.

Step ST1 and step ST2 are described specifically below.

Figure 6:
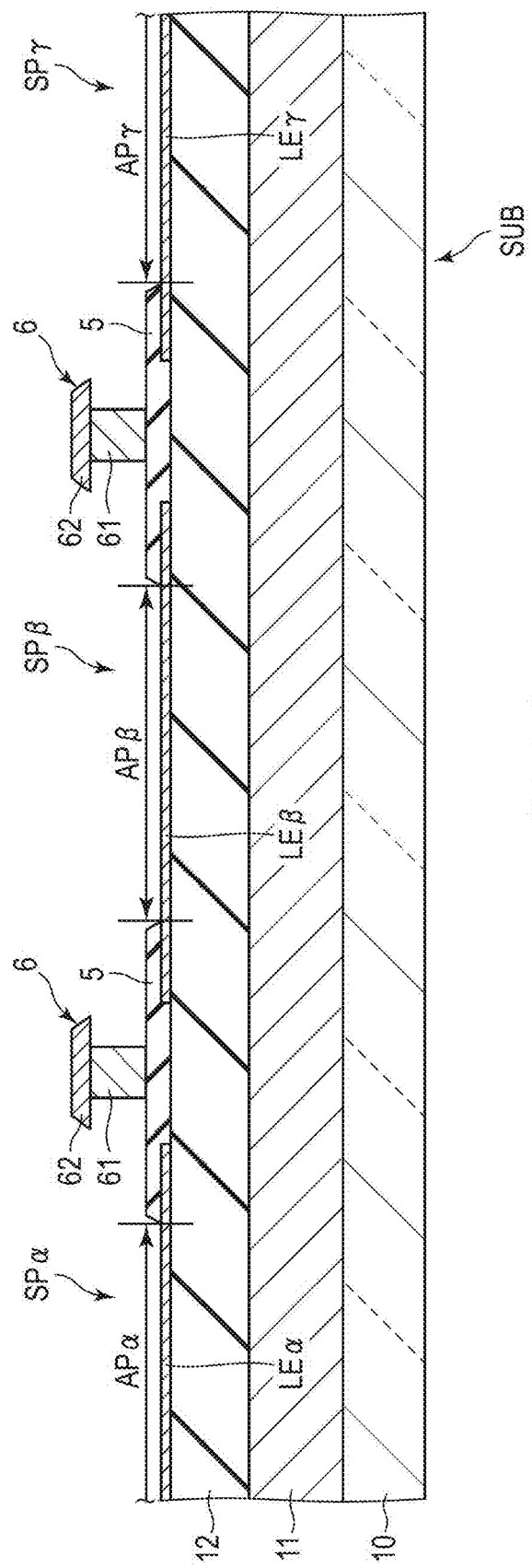
FIG. 6 illustrates a process of preparing a processing substrate.

First, in step ST1, as shown in FIG. 6, the processing substrate SUB, in which, a lower electrode LEα of the sub-pixel SPα, a lower electrode LEβ of the sub-pixel SPβ, a lower electrode LEγ of the sub-pixel SPγ, the rib 5 including apertures APα, APβ, and APγ overlapping each of the lower electrodes LEα, LEβ, and LEγ, and the partition 6 including the lower portion 61 disposed on the rib 5 and the upper portion 62 disposed on the lower portion 61 and protruding from the side surface of the lower portion 61 is formed above the substrate 10, is prepared. Note that, in FIG. 7 to FIG. 12, the substrate 10 and the circuit layer 11 in layers lower than the insulating layer 12 are omitted.

Then, in step ST21, as shown in FIG. 7, the first thin film 31 is formed over the sub-pixel SPα, the sub-pixel SPβ, and the sub-pixel SPγ. The process of forming the first thin film 31 includes a process of forming the organic layer OR10 including the light-emitting layer EMα on the processing substrate SUB (ST211), a process of and forming the upper electrode UE10 on the organic layer OR10 (ST212), a process of forming the transparent layer TL10 on the upper electrode UE10 (ST213), a process of forming the inorganic layer IL10 on the transparent layer TL10 (ST214), and a process of forming the sealing layer SE10 on the inorganic layer IL10 (ST215). That is, in the illustrated example, the first thin film 31 includes the organic layer OR10, the upper electrode UE10, the transparent layer TL10, the inorganic layer IL10, and the sealing layer SE10.

The organic layer OR10 includes a first organic layer OR11, a second organic layer OR12, a third organic layer OR13, a fourth organic layer OR14, and a fifth organic layer OR15. The first organic layer OR11, the second organic layer OR12, the third organic layer OR13, the fourth organic layer OR14, and the fifth organic layer OR15 all include the light-emitting layer EMα formed of the same material.

The first organic layer OR11 is formed to cover the lower electrode LEα. The second organic layer OR12 is spaced apart from the first organic layer OR11 and is located on the upper portion 62 of the partition 6 between the lower electrode LEα and the lower electrode LEβ. The third organic layer OR13 is space apart from the second organic layer OR12 and is formed to cover the lower electrode LEβ. The fourth organic layer OR14 is spaced apart from the third organic layer OR13 and is located on the upper portion 62 of the partition 6 between the lower electrode LEβ and the lower electrode LEγ. The fifth organic layer OR15 is spaced apart from the fourth organic layer OR14 and is formed to cover the lower electrode LEγ.

The upper electrode UE10 includes a first upper electrode UE11, a second upper electrode UE12, a third upper electrode UE13, a fourth upper electrode UE14, and a fifth upper electrode UE15.

The first upper electrode UE11 is located on the first organic layer OR11 and is in contact with the lower portion 61 of the partition 6 between the lower electrode LEα and the lower electrode LEβ. The second upper electrode UE12 is spaced apart from the first upper electrode UE11 and is located on the second organic layer OR12 between the lower electrode LEα and the lower electrode LEβ. The third upper electrode UE13 is spaced apart from the second upper electrode UE12 and is located on the third organic layer OR13. In the illustrated example, the third upper electrode UE13 is in contact with the lower portion 61 of the partition 6 between the lower electrode LEα and the lower electrode LEβ and is in contact with the lower portion 61 of the partition 6 between the lower electrode LEβ and the lower electrode LEγ, but may be in contact with one of the lower portions 61. The fourth upper electrode UE14 is spaced apart from the third upper electrode UE13 and is located on the fourth organic layer OR14 between the lower electrode LEβ and the lower electrode LEγ. The fifth upper electrode UE15 is spaced apart from the fourth upper electrode UE14, is located on the fifth organic layer OR15, and is in contact with the lower portion 61 of the partition 6 between the lower electrode LEβ and the lower electrode LEγ.

The transparent layer TL10 includes a first transparent layer TL11, a second transparent layer TL12, a third transparent layer TL13, a fourth transparent layer TL14, and a fifth transparent layer TL15.

The first transparent layer TL11 is located on the first upper electrode UE11. The second transparent layer TL12 is spaced apart from the first transparent layer TL11 and is located on the second upper electrode UE12. The third transparent layer TL13 is spaced apart from the second transparent layer TL12 and is located on the third upper electrode UE13. The fourth transparent layer TL14 is spaced apart from the third transparent layer TL13 and is located on the fourth upper electrode UE14. The fifth transparent layer TL15 is spaced apart from the fourth transparent layer TL14 and is located on the fifth upper electrode UE15.

The inorganic layer IL10 includes a first inorganic layer IL11, a second inorganic layer IL12, a third inorganic layer IL13, a fourth inorganic layer IL14, and a fifth inorganic layer IL15. The first inorganic layer IL11, the second inorganic layer IL12, the third inorganic layer IL13, the fourth inorganic layer IL14, and the fifth inorganic layer IL15 are single-layer thin films formed by lithium fluoride. The thickness of each of the first inorganic layer IL11, the second inorganic layer IL12, the third inorganic layer IL13, the fourth inorganic layer IL14, and the fifth inorganic layer IL15 is 20 nm or more and 200 nm or less.

The first inorganic layer IL11 is located on the first transparent layer TL11. The refractive index of the first inorganic layer IL11 is smaller than that of the first transparent layer TL11.

The second inorganic layer IL12 is spaced apart from the first inorganic layer IL11 and is located on the second transparent layer TL12. The refractive index of the second inorganic layer IL12 is smaller than that of the second transparent layer TL12.

The third inorganic layer IL13 is spaced apart from the second inorganic layer IL12 and is located on the third transparent layer TL13. The refractive index of the third inorganic layer IL13 is smaller than that of the third transparent layer TL13.

The fourth inorganic layer IL14 is spaced apart from the third inorganic layer IL13 and is located on the fourth transparent layer TL14. The refractive index of the fourth inorganic layer IL14 is smaller than that of the fourth transparent layer TL14.

The fifth inorganic layer IL15 is spaced apart from the fourth inorganic layer IL14 and is located on the fifth transparent layer TL15. The refractive index of the fifth inorganic layer IL15 is smaller than that of the fifth transparent layer TL15.

The sealing layer SE10 is formed to cover the first inorganic layer IL11, the second inorganic layer IL12, the third inorganic layer IL13, the fourth inorganic layer IL14, the fifth inorganic layer IL15, and the partition 6. The sealing layer SE10 is formed by silicon nitride, which is an inorganic material. The sealing layer SE10 covering the partition 6 contacts the lower part of the upper portion 62 and the side surface of the lower portion 61.

Figure 8:
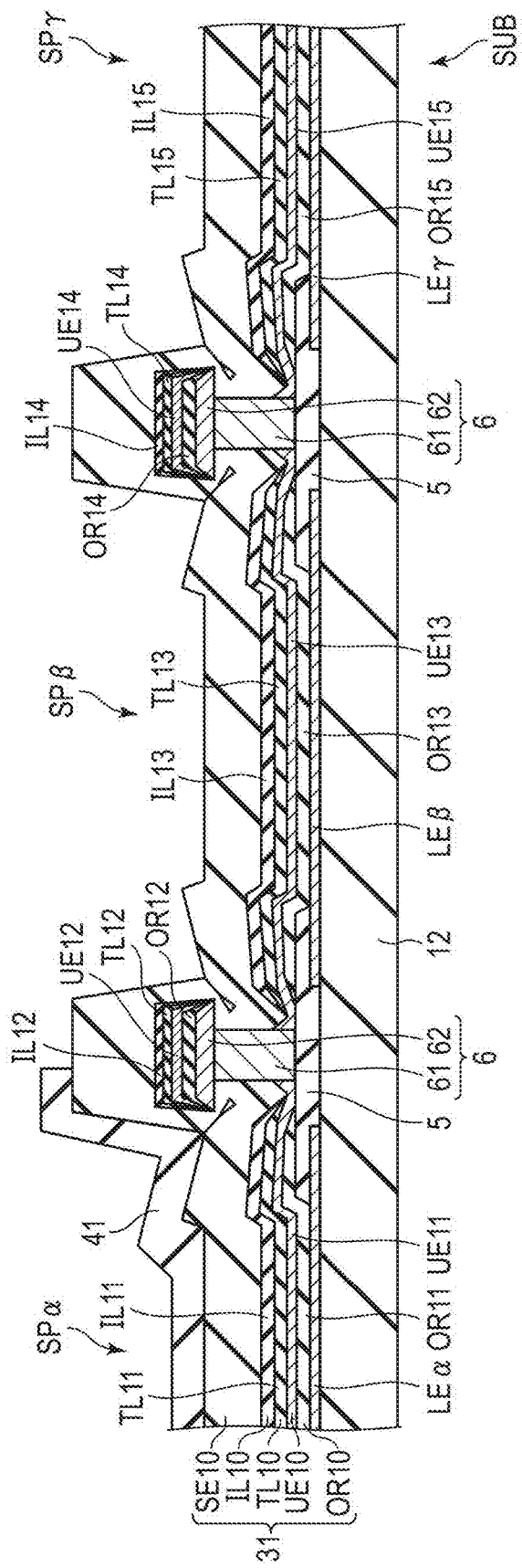
FIG. 8 illustrates a process of forming a resist.

Then, in step ST22, as shown in FIG. 8, a resist is applied on the sealing layer SE10, and this resist is patterned. The resist 41 formed by being patterned in this manner covers the sub-pixel SPα. That is, the resist 41 is disposed directly above the lower electrode LEα, the first organic layer OR11, the first upper electrode UE11, the first transparent layer TL11, and the first inorganic layer IL11. The resist 41 also extends from the sub-pixel SPα to above the partition 6. Directly above the partition 6 between the sub-pixel SPα and the sub-pixel SPβ, the resist 41 is disposed on the sub-pixel SPα side (left side in the drawing) and exposes the sealing layer SE10 on the sub-pixel SPβ side (right side in the drawing). In the illustrated example, the resist 41 exposes the sealing layer SE10 in the sub-pixel SPβ and the sub-pixel SPγ.

Figure 9:
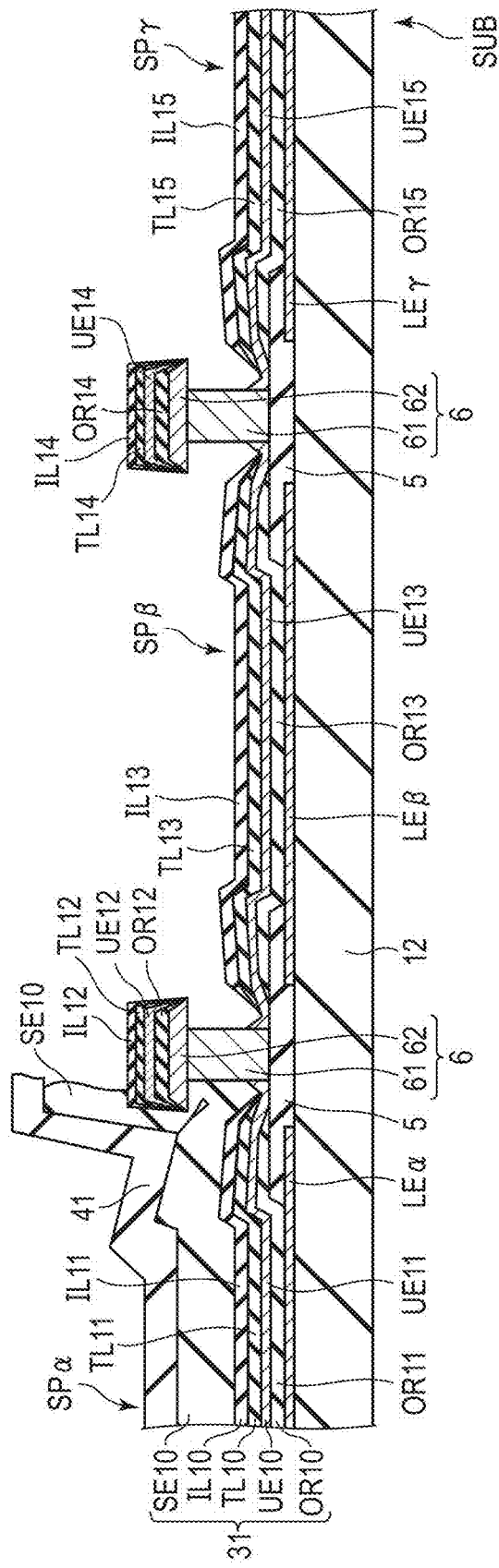
FIG. 9 illustrates a first etching (dry etching) of the first thin film.

Then, in step ST231, as shown in FIG. 9, using the resist 41 as a mask, dry etching is performed as a first etching of the first thin film 31 to remove the sealing layer SE10 exposed from the resist 41.

By this dry etching, the sealing layer SE10 of the sub-pixel SPβ and the sub-pixel SPγ is removed, and the third inorganic layer IL13 of the sub-pixel SPβ and the fifth inorganic layer IL15 of the sub-pixel SPγ are exposed from the sealing layer SE10. The sealing layer SE10 remains in the sub-pixel SPα.

In addition, regarding the lower portion 61, the upper portion 62, and the second inorganic layer IL12 between the sub-pixel SPα and the sub-pixel SPβ, the respective sub-pixel SPα sides are covered by the sealing layer SE10 while the respective sub-pixel SPβ sides are exposed from the sealing layer SE10. The lower portion 61, the upper portion 62, and the fourth inorganic layer IL14 between the sub-pixel SPβ and the sub-pixel SPγ are exposed from the sealing layer SE10. Such an inorganic layer IL10 functions as an etching stopper layer when the sealing layer SE10 is removed by dry etching.

In such a manner, the sealing layer SE10 of the first thin film 31 is formed to have a predetermined shape by dry etching.

Figure 10:
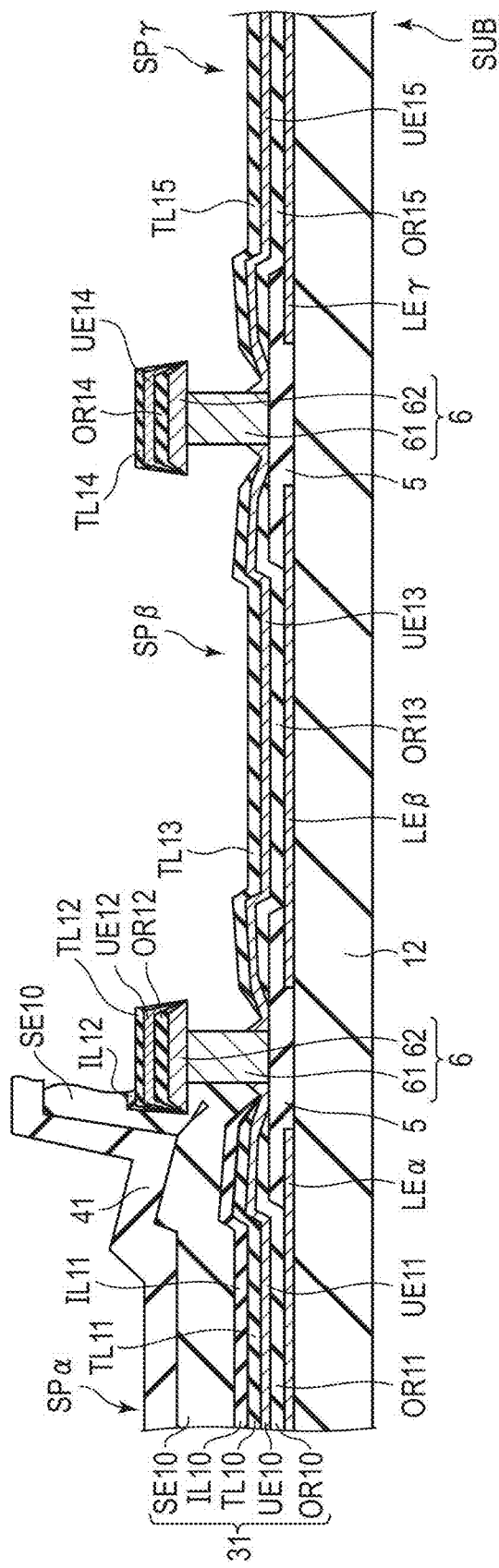
FIG. 10 illustrates a second etching (wet etching) of the first thin film.

Then, in step ST232, as shown in FIG. 10, using the resist 41 as a mask, wet etching using an acidic solution is performed as a second etching of the first thin film 31 to remove the inorganic layer IL10 exposed from the resist 41. The acidic solution here is, for example, a solution of at least one organic acid of formic acid, acetic acid, propionic acid, and butanoic acid. Alternatively, the acidic solution here is a solution of at least one inorganic acid of nitric acid and hydrochloric acid. In one example, acetic acid is applied as the acidic solution. The acetic acid concentration is at least 0.01%, and preferably is, for example, 0.1% or higher and 15% or lower. The pH of the acidic solution is, for example, 2.5 or higher and 3.6 or lower. The rationale for these numerical ranges is based on the results of Experiments 1 and 2 described later.

This wet etching removes a part of the second inorganic layer IL12 (on the sub-pixel SPβ side), all of the third inorganic layer IL13, all of the fourth inorganic layer IL14, and all of the fifth inorganic layer IL15. As a result, a part of the second transparent layer TL12 (on the sub-pixel SPβ side) is exposed, and also the third transparent layer TL13, the fourth transparent layer TL14, and the fifth transparent layer TL15 are exposed. The first transparent layer TL11 remains on the sub-pixel SPα.

Figure 11:
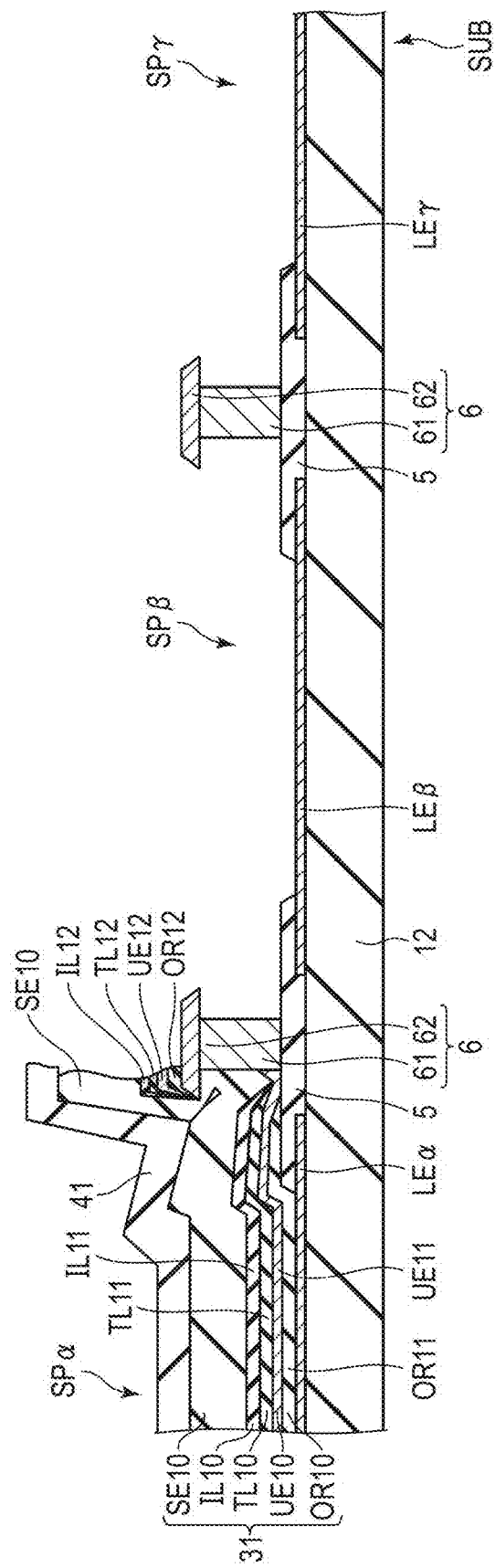
FIG. 11 illustrates a third etching of the first thin film.

Then, as shown in FIG. 11, a third etching of the first thin film 31 is performed using the resist 41 as a mask. In this third etching, first, in step ST233, a part of the second transparent layer TL12, all of the third transparent layer TL13, all of the fourth transparent layer TL14, and all of the fifth transparent layer TL15 which are exposed from the resist 41, are removed. Then, in step ST234, a part of the second upper electrode UE12, all of the third upper electrode UE13, all of the fourth upper electrode UE14, and all of the fifth upper electrode UE15 which are exposed from the resist 41, are removed. Then, in step ST235, a part of the second organic layer OR12, all of the third organic layer OR13, all of the fourth organic layer OR14, and all of the fifth organic layer OR15 which are exposed from the resist 41, are removed.

As a result, the lower electrode LEβ is exposed in the sub-pixel SPβ, and the lower electrode LEγ is exposed in the sub-pixel SPγ.

Regarding the partition 6 between the sub-pixel SPα and the sub-pixel SPβ, directly above the upper portion 62, the second organic layer OR12, the second upper electrode UE12, the second transparent layer TL12, the second inorganic layer IL12, and the sealing layer SE10 remain on the sub-pixel SPα side, and the second organic layer OR12, the second upper electrode UE12, the second transparent layer TL12, the second inorganic layer IL12, and the sealing layer SE10 are removed on the sub-pixel SPβ side. Therefore, on the sub-pixel SPβ side, the upper portion 62 is exposed.

Also, regarding the rib 5 between the sub-pixel SPα and the sub-pixel SPβ, the sub-pixel SPβ side is exposed.

Also, regarding the partition 6 between the sub-pixel SPβ and the sub-pixel SPγ, the lower portion 61 and the upper portion 62 are exposed.

Also, regarding the rib 5 between the sub-pixel SPβ and the sub-pixel SPγ, the sub-pixel SPβ side and the sub-pixel SPγ side are exposed respectively.

Then, as shown in FIG. 12, in step ST24, the resist 41 is removed. As a result, the sealing layer SE10 of the sub-pixel SPα is exposed. After these steps ST21 to ST24, the display element 21 is formed in the sub-pixel SPα. The display element 21 is configured by the lower electrode LEα, the first organic layer OR11, the first upper electrode UE11, and the first cap layer CP11 (including the first transparent layer TL11 and the first inorganic layer IL11). The display element 21 is covered by the sealing layer SE10.

The sub-pixel SPα in the above example is one of the sub-pixels SP1, SP2, or SP3 shown in FIG. 2. For example, in the case where the sub-pixel SPα corresponds to the sub-pixel SP1, the lower electrode LEα corresponds to the lower electrode LE1, the first organic layer OR11 corresponds to the first portion OR1a, the second organic layer OR12 corresponds to the second portion OR1b, the light-emitting layer EMα corresponds to the first light-emitting layer EM1, the first upper electrode UE11 corresponds to the first portion UE1a, the second upper electrode UE12 corresponds to the second portion UE1b, the first cap layer CP11 (including the first transparent layer TL11 and the first inorganic layer IL11) corresponds to the first portion CP1a, the second cap layer CP12 (including the second transparent layer TL12 and the second inorganic layer IL12) corresponds to the second portion CP1b, and the sealing layer SE10 corresponds to the sealing layer SE1.

According to the present embodiment, a patterning technique for the inorganic layer IL that configures the cap layer CP can be established. In addition, an acetic acid solution can be applied as an acidic solution to remove the inorganic layer IL formed by lithium fluoride. Since the acidic solution has a single composition, it is easy to control the concentration and has a small environmental impact.

In addition, since the inorganic layer IL covering the sub-pixels SPβ and SPγ described in the above example is reliably removed, the transparent layer TL, the upper electrode UE, and the organic layer OR can be removed. Therefore, in the sub-pixel formation process at a later stage, display elements of a desired shape can be formed in the other sub-pixels SPβ and SPγ, respectively. In addition, in each sub-pixel, the upper electrode UE and the lower portion 61 of the partition 6 can be electrically connected reliably. Thus, reliability can be improved.

Next, an inventor prepared acetic acid solutions with different concentrations (weight % concentration) and conducted Experiment 1 to check whether lithium fluoride can be dissolved or not using these acetic acid solutions. In Experiment 1, first, a processing substrate is prepared on which the organic layer OR10 and the upper electrode UE10 explained with reference to FIG. 7 are formed, then a lithium fluoride layer is formed. The thickness of the lithium fluoride layer is approximately 80 nm. The time for immersing the processing substrate in the acetic acid solution was 2 minutes. After that, it was checked on whether or not the lithium fluoride layer remained and whether or not there was any damage to the partition 6 caused by dissolution by the acetic acid solution.

FIG. 13 shows the results of Experiment 1.

In a case where an acetic acid solution with a concentration of 0.01% (pH 3.6) was applied, a part of the lithium fluoride layer remained and no damage to the partition 6 was observed.

In a case where an acetic acid solution with a concentration of 0.1% (pH 3.4) was applied, no lithium fluoride layer remained and no damage to the partition 6 was observed.

In a case where an acetic acid solution with a concentration of 0.5% (pH 3.0) was applied, no lithium fluoride layer remained and no damage to the partition 6 was observed.

In a case where an acetic acid solution with a concentration of 1% (pH 2.8) was applied, no lithium fluoride layer remained and no damage to the partition 6 was observed.

In a case where an acetic acid solution with a concentration of 2% (pH 2.7) was applied, no lithium fluoride layer remained and no damage to the partition 6 was observed.

In a case where an acetic acid solution with a concentration of 99.8% (pH 2.5) was applied, no lithium fluoride layer remained and no damage to the partition 6 was observed.

The inventor repeated the same experiment multiple times using the same concentration of acetic acid solution, and confirmed that the lithium fluoride layer could be stably dissolved when the concentration of the acetic acid solution was 0.1%. In addition, in the case where the concentration of the acetic acid solution was 99.8%, there was no damage to the partition 6 even when the immersion time was extended to 10 minutes.

The dissolution of the lithium fluoride layer progresses by extending the immersion time of the processing substrate in the acetic acid solution. Therefore, even when the acetic acid concentration is 0.01%, all of the lithium fluoride layer can be removed by extending the immersion time longer than 2 minutes.

Based on the results of Experiment 1 above, it was confirmed that to apply acetic acid solution as an acidic solution is suitable from the viewpoint of reliably removing the lithium fluoride layer and suppressing damage to the partition 6. In addition, it was confirmed that the lithium fluoride layer can be removed if the acetic acid concentration is in the range of 0.01% or higher (pH 3.6 or lower), preferably, in a range higher than of 0.01% (lower than pH 3.6). According to the results of Experiment 1, the acetic acid concentration that can remove the lithium fluoride layer is 0.01% or higher and 99.8% or lower, preferably, higher than 0.01% and 99.8% or lower. Furthermore, the pH of the acidic solution that can remove the lithium fluoride layer is 2.5 or higher and 3.6 or lower, and, preferably, 2.5 or higher and lower than 3.6.

Next, the inventor prepared acetic acid solutions with different concentrations (weight % concentration) and conducted Experiment 2 to confirm whether lithium fluoride can be dissolved or not by changing the immersion time with these acetic acid solutions. In Experiment 2, first, a processing substrate is prepared on which the organic layer OR10 and the upper electrode UE10 explained with reference to FIG. 7 are formed, then a lithium fluoride layer is formed. The thickness of the lithium fluoride layer is approximately 100 nm. After that, it was checked on whether or not the lithium fluoride layer remained.

FIG. 14 shows the results of Experiment 2.

In a case where an acetic acid solution with a concentration of 0.1% was applied, a small amount of lithium fluoride layer remained when the immersion time was 5 minutes, and no lithium fluoride layer remained when the immersion time was 10 and 15 minutes.

In a case where an acetic acid solution with a concentration of 0.5% was applied, a small amount of lithium fluoride layer remained when the immersion time was 5 minutes, and no lithium fluoride layer remained when the immersion time was 10 and 15 minutes.

In a case where an acetic acid solution with a concentration of 1% was applied, a small amount of lithium fluoride layer remained when the immersion time was 5 minutes, and no lithium fluoride layer remained when the immersion time was 10 and 15 minutes.

In a case where an acetic acid solution with a concentration of 2% was applied, a small amount of lithium fluoride layer remained when the immersion time was 5 minutes, and no lithium fluoride layer remained when the immersion time was 10 and 15 minutes.

In a case where an acetic acid solution with a concentration of 5% was applied, a small amount of lithium fluoride layer remained when the immersion time was 5 minutes, and no lithium fluoride layer remained when the immersion time was 10 and 15 minutes.

In a case where an acetic acid solution with a concentration of 10% was applied, a small amount of lithium fluoride layer remained when the immersion time was 5 minutes, and no lithium fluoride layer remained when the immersion time was 10 and 15 minutes.

In a case where an acetic acid solution with a concentration of 15% was applied, a small amount of lithium fluoride layer remained when the immersion time was 5 minutes, and no lithium fluoride layer remained when the immersion time was 10 and 15 minutes.

Based on the results of Experiment 2 above, it was confirmed that there was almost no difference in the dissolution rate of the lithium fluoride layer in the range of acetic acid concentration between 0.1% and 15%. The optimum immersion time to ensure removal of the lithium fluoride layer depends on the thickness of the lithium fluoride layer. For example, as shown in Experiment 2 above, in a case where the thickness of the lithium fluoride layer is 100 nm, the immersion time should be set to longer than 5 minutes, preferably to 10 minutes or longer.

As explained above, the present embodiment can provide a method of manufacturing a display device that can improve reliability and increase manufacturing yield.

Based on the method of manufacturing a display device, which has been described in the above-described embodiments, a person having ordinary skill in the art may achieve a method of manufacturing a display device with an arbitral design change; however, as long as they fall within the scope and spirit of the present invention, such a manufacturing method is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A method of manufacturing a display device, comprising:
    preparing a processing substrate in which a lower electrode, a rib having an aperture overlapping the lower electrode, and a partition including a lower portion disposed on the rib and an upper portion disposed on the lower portion and protruding from a side surface of the lower portion are formed above a substrate;
    forming a first organic layer covering the lower electrode, and a second organic layer spaced apart from the first organic layer and located on the upper portion;
    forming a first upper electrode located on the first organic layer and in contact with the lower portion, and a second upper electrode spaced apart from the first upper electrode and located on the second organic layer;
    forming a first transparent layer located on the first upper electrode, and a second transparent layer spaced apart from the first transparent layer and located on the second upper electrode;
    forming a first inorganic layer located on the first transparent layer, and a second inorganic layer spaced apart from the first inorganic layer and located on the second transparent layer;
    forming a sealing layer located on the first inorganic layer and the second inorganic layer and covering the partition;
    forming a resist covering the sealing layer directly above the lower electrode and covering a part of the sealing layer directly above the partition;
    performing dry etching using the resist as a mask to remove the sealing layer exposed from the resist; and
    performing wet etching by an acidic solution using the resist as a mask to remove the second inorganic layer exposed from the resist.

2. The method of manufacturing a display device of claim 1, wherein the first inorganic layer and the second inorganic layer are formed by lithium fluoride (LiF).

3. The method of manufacturing a display device of claim 2, wherein thickness of the first inorganic layer and the second inorganic layer is 20 nm or more and 200 nm or less.

4. The method of manufacturing a display device of claim 2, wherein refractive indices of the first inorganic layer and the second inorganic layer are smaller than those of the first transparent layer and the second transparent layer.

5. The method of manufacturing a display device of claim 1, wherein the acidic solution is a solution of at least one of the following organic acids: formic acid, acetic acid, propionic acid, and butanoic acid.

6. The method of manufacturing a display device of claim 5, wherein the acidic solution is an acetic acid solution, and an acetic acid concentration is 0.01% or higher.

7. The method of manufacturing a display device of claim 6, wherein the acetic acid concentration is 0.1% or higher and 15% or lower.

8. The method of manufacturing a display device of claim 5, wherein pH of the acidic solution is 2.5 or higher and 3.6 or lower.

9. The method of manufacturing a display device of claim 1, wherein the acidic solution is a solution of at least one of the following inorganic acids: nitric acid and hydrochloric acid.

10. The method of manufacturing a display device of claim 1, wherein the first organic layer and the second organic layer include light emitting layers formed of a same material.

11. The method of manufacturing a display device of claim 1, further comprising removing the second transparent layer exposed from the resist using the resist as a mask.

12. The method of manufacturing a display device of claim 11, further comprising removing the second upper electrode exposed from the resist using the resist as a mask.

13. The method of manufacturing a display device of claim 12, further comprising removing the second organic layer exposed from the resist using the resist as a mask.

* * * * *